(12) United States Patent
Koch et al.

(10) Patent No.: US 10,236,541 B2
(45) Date of Patent: Mar. 19, 2019

(54) BATTERY CELL TESTING FIXTURE

(71) Applicant: GM GLOBAL TECHNOLOGY OPERATIONS LLC, Detroit, MI (US)

(72) Inventors: Brian J Koch, Berkley, MI (US);
Ashley McAllister, Macomb, MI (US);
Robert S Conell, Sterling Heights, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 192 days.

(21) Appl. No.: 15/252,556

(22) Filed: Aug. 31, 2016

(65) Prior Publication Data
US 2018/0062216 A1   Mar. 1, 2018

(51) Int. Cl.
| | | |
|---|---|---|
| B60R 16/03 | (2006.01) | |
| G01R 31/36 | (2006.01) | |
| H01M 10/42 | (2006.01) | |
| H01M 10/48 | (2006.01) | |
| G01R 31/388 | (2019.01) | |
| B60L 11/18 | (2006.01) | |

(52) U.S. Cl.
CPC ..... *H01M 10/4285* (2013.01); *B60L 11/1861* (2013.01); *B60R 16/03* (2013.01); *G01R 31/3648* (2013.01); *G01R 31/388* (2019.01); *H01M 10/425* (2013.01); *H01M 10/482* (2013.01); *H01M 2010/4271* (2013.01); *H01M 2220/20* (2013.01)

(58) Field of Classification Search
CPC .......... H01M 10/4285; H01M 10/425; H01M 10/482; H01M 2010/4271; H01M 2220/20; G01R 31/3648; G01R 31/3637; B60R 16/03; B60L 11/1861
USPC .......................................... 324/437; 429/129
See application file for complete search history.

(56) References Cited

U.S. PATENT DOCUMENTS

| | | | | |
|---|---|---|---|---|
| 9,379,418 | B2* | 6/2016 | Wang | H01M 4/70 |
| 2013/0052509 | A1* | 2/2013 | Halalay | H01M 2/145 |
| | | | | 429/129 |
| 2014/0023888 | A1* | 1/2014 | Fulop | H01M 2/30 |
| | | | | 429/50 |
| 2015/0226810 | A1* | 8/2015 | Elian | H04Q 9/00 |
| | | | | 429/90 |

\* cited by examiner

*Primary Examiner* — Farhana A Hoque

(57) ABSTRACT

A battery cell testing fixture is provided which includes a user interface, a separator assembly and an optional stand. The user interface includes a module for receiving input voltage data from at least one circuit to provide a variety of battery cell conditions. The separator assembly includes an integrated reference electrode or reference component. The separator assembly is operatively configured to be used with a plurality of test batteries in succession. The separator assembly may be operatively configured to communicate with a current collector, a meter and the user interface.

5 Claims, 8 Drawing Sheets

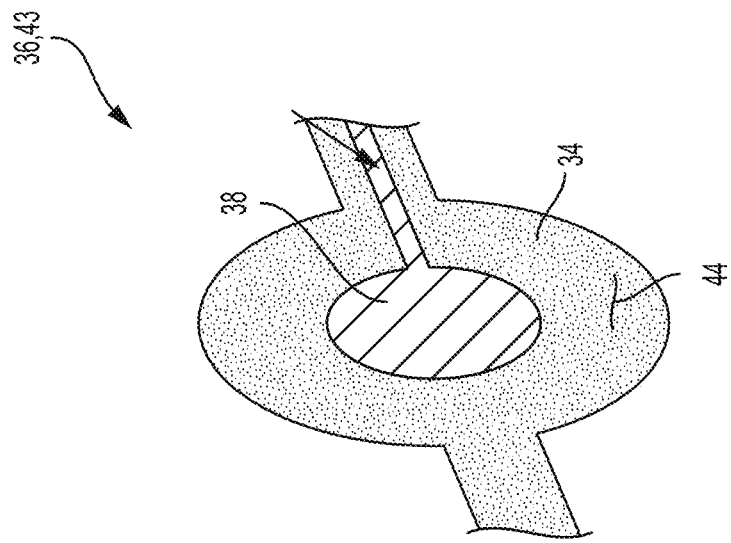
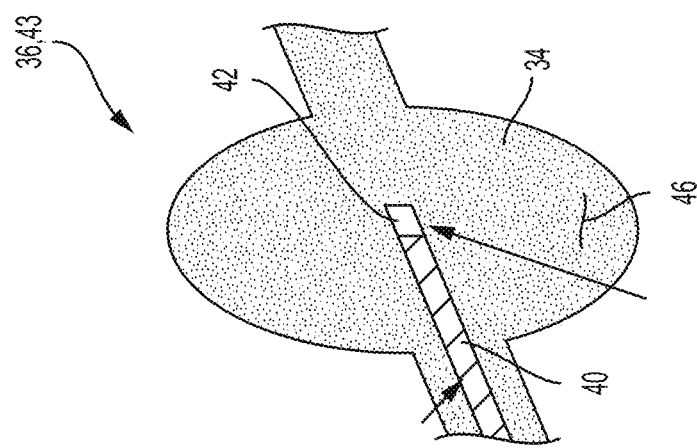

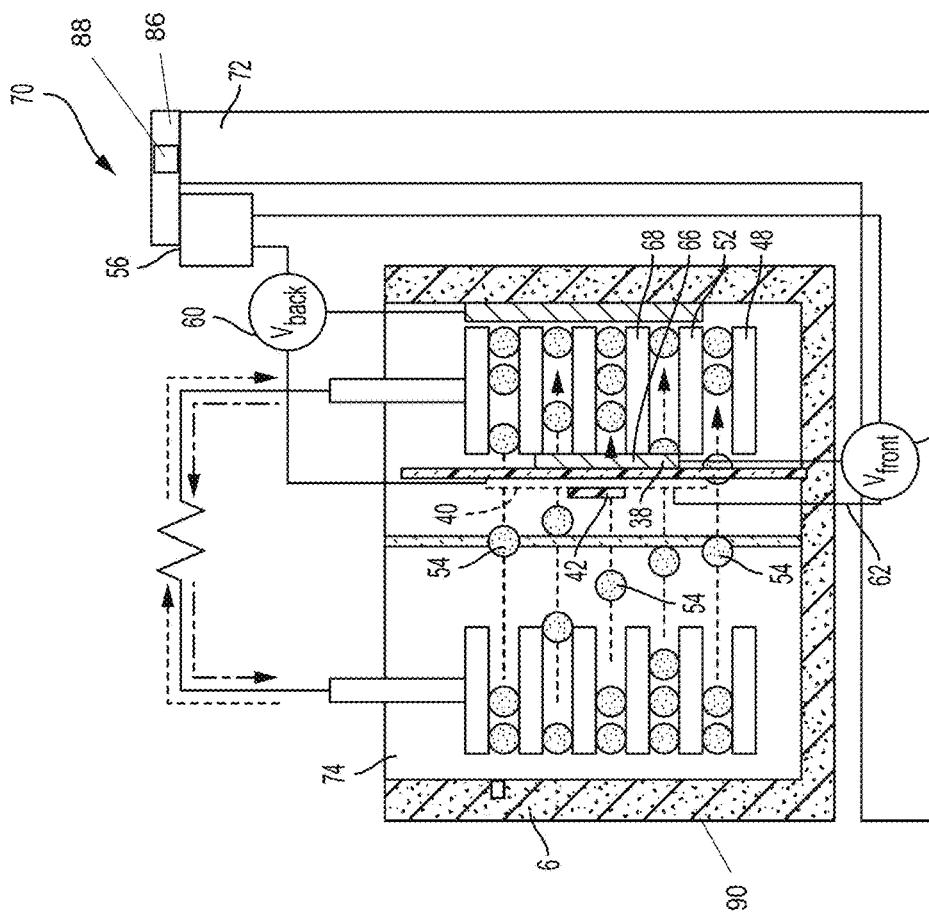
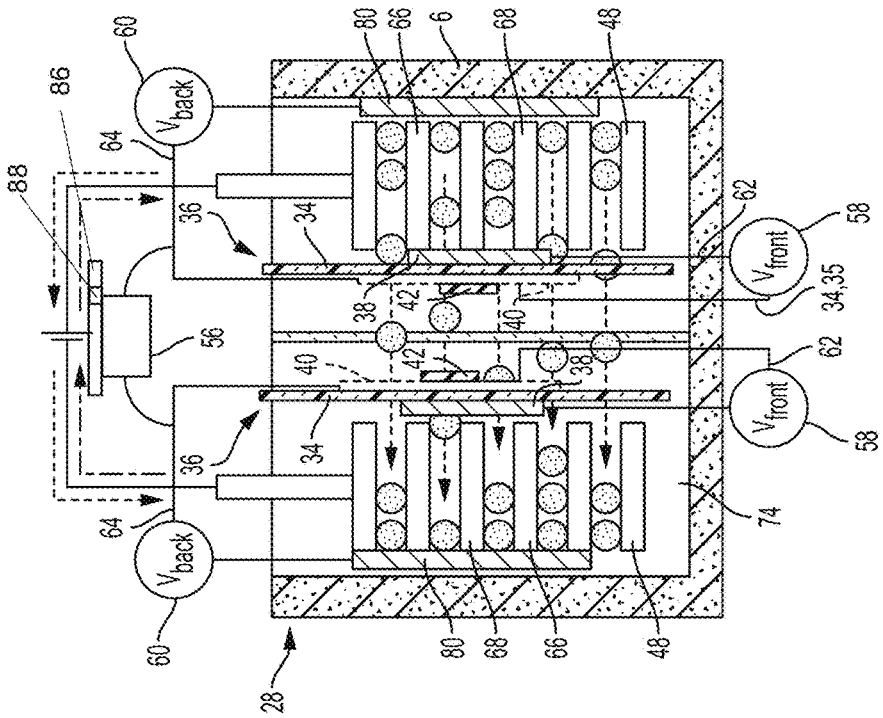
FIG. 4A
FIG. 4B

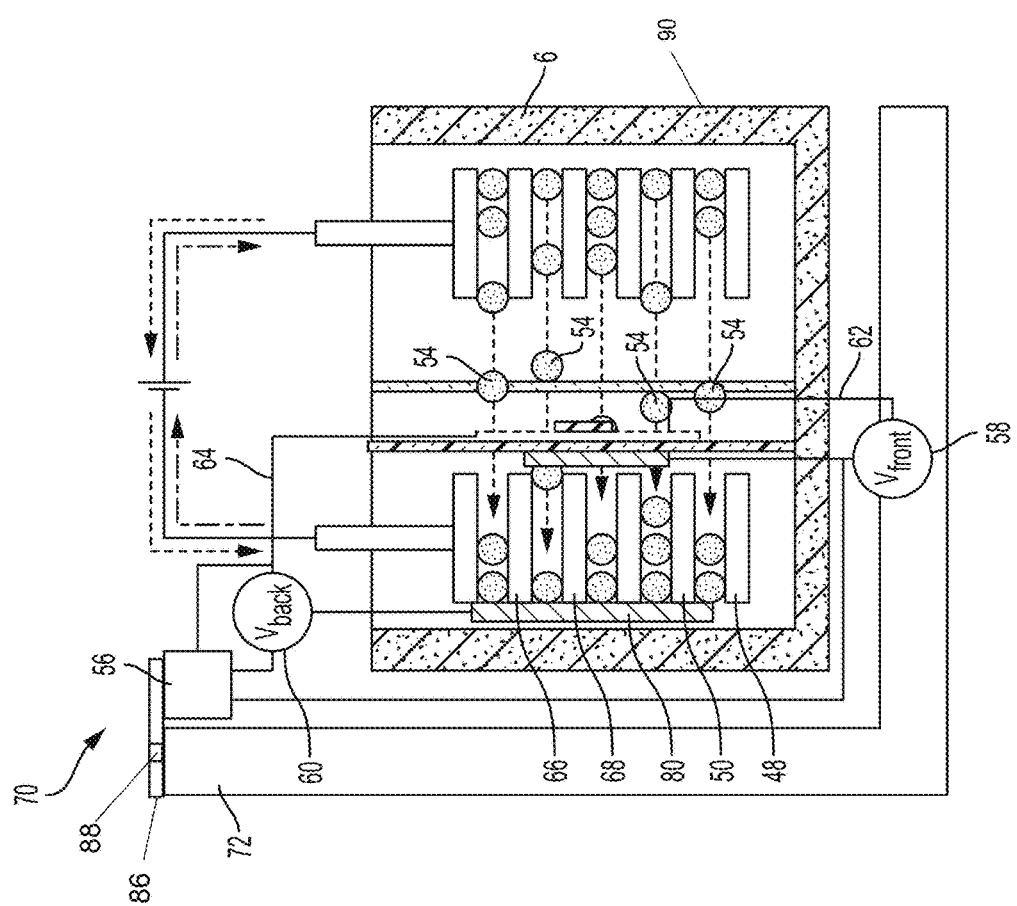

BATTERY CELL TESTING FIXTURE

TECHNICAL FIELD

The present disclosure relates generally to the field of lithium-ion batteries and battery modules. More specifically, the present disclosure relates to a battery cell testing fixture which includes a separator having an integrated reference electrode.

BACKGROUND

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

A vehicle that uses one or more battery systems for providing all or a portion of the motive power for the vehicle can be referred to as an xEV, where the term "xEV" is defined herein to include all of the following vehicles, or any variations or combinations thereof, that use electric power for all or a portion of their vehicular motive force. For example, xEVs include electric vehicles (EVs) that utilize electric power for all motive force. As will be appreciated by those skilled in the art, hybrid electric vehicles (HEVs), also considered xEVs, combine an internal combustion engine propulsion system and a battery-powered electric propulsion system, such as 48 Volt (V) or 130V systems. The term HEV may include any variation of a hybrid electric vehicle. For example, full hybrid systems (FHEVs) may provide motive and other electrical power to the vehicle using one or more electric motors, using only an internal combustion engine, or using both. In contrast, mild hybrid systems (MHEVs) disable the internal combustion engine when the vehicle is idling and utilize a battery system to continue powering the air conditioning unit, radio, or other electronics, as well as to restart the engine when propulsion is desired. The mild hybrid system may also apply some level of power assist, during acceleration for example, to supplement the internal combustion engine. Mild hybrids are typically 96V to 130V and recover braking energy through a belt or crank integrated starter generator. For the purposes of the present discussion, it should be noted that mHEVs typically do not technically use electric power provided directly to the crankshaft or transmission for any portion of the motive force of the vehicle, but an mHEV may still be considered as an xEV since it does use electric power to supplement a vehicle's power needs when the vehicle is idling with internal combustion engine disabled and recovers braking energy through an integrated starter generator. In addition, a plug-in electric vehicle (PEV) is any vehicle that can be charged from an external source of electricity, such as wall sockets, and the energy stored in the rechargeable battery packs drives or contributes to drive the wheels. PEVs are a subcategory of EVs that include all-electric or battery electric vehicles (BEVs), plug-in hybrid electric vehicles (PHEVs), and electric vehicle conversions of hybrid electric vehicles and conventional internal combustion engine vehicles.

xEVs as described above may provide a number of advantages as compared to more traditional gas-powered vehicles using only internal combustion engines and traditional electrical systems, which are typically 12V systems powered by a lead acid battery. For example, xEVs may produce fewer undesirable emission products and may exhibit greater fuel efficiency as compared to traditional internal combustion vehicles and, in some cases, such xEVs may eliminate the use of gasoline entirely, as is the case of certain types of EVs or PEVs.

As xEV technology continues to evolve, there is a need to provide improved power sources (e.g., battery systems or modules) for such vehicles. For example, it is desirable to increase the distance that such vehicles may travel without the need to recharge the batteries. Additionally, it may also be desirable to optimize the performance of such batteries and to reduce the cost associated with the battery systems by monitoring the state of charge for the battery cells. For instance, it is now recognized that it may be desirable to provide a feature which is part of the battery module and is capable of providing the status of the battery cell which includes but is not limited to the state of charge (SOC).

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

A battery cell separator assembly provides a base layer, a first contact, a second contact and a reference component. The base layer includes a first side and a second side. The first contact is affixed on the first side of the base layer between the base layer and an anode. The second contact is affixed on the second side of the base layer. A reference component is disposed on the second contact. The battery cell separator assembly may be implemented in a variety of locations, such as, but not limited to, a vehicle battery for on-board vehicle use as well as in a battery cell test fixture.

A battery cell system is also provided which includes: an anode, a cathode, a separator formed from a base layer, first and second contacts and a reference component. The anode and cathode are disposed in a lithium ion non-aqueous solution within a housing. The base layer of the separator includes a first side and a second side. The base layer is operatively configured to separate the anode and the cathode within the housing. The first contact of the separator is affixed to the first side of the base layer between the base layer and an anode. The second contact is affixed to the second side of the base layer with the reference component disposed on the second contact.

Additionally, a battery cell testing fixture may also be provided which includes: a stand, a housing, a meter and a separator formed from a base layer, first and second contacts and a reference component. The housing is operatively configured to hold an anode and a cathode in a lithium ion solution and is disposed on or affixed to the stand. The separator includes a base layer having a first side and a second side disposed in the lithium ion solution. The base layer is operatively configured to separate the anode and the cathode in the lithium ion solution disposed within a housing. The first contact may be affixed to the first side of the base layer so that the first contact is positioned directly between the base layer and the anode. The second contact may be affixed to the second side of the base layer and used as a base for the reference component. A meter may be in communication with the reference component via the second contact such that the meter reads the voltage difference between the reference component and (1) anode current collector located on the backside of the anode; and (2) the first contact located on the front side of the anode.

BRIEF DESCRIPTION OF THE DRAWINGS

These and other features and advantages of the present disclosure will be apparent from the following detailed description of preferred embodiments, and best mode, appended claims, and accompanying drawings in which:

FIG. 3A is a schematic view of the second side of a base layer (separator) with the porous gold contact layer and porous reference component affixed to the second side of the base layer.

FIG. 3B is a schematic view of the first side of the base layer (separator) with the porous copper contact layer affixed to the first side of the base layer.

FIG. 4A is a cross-sectional schematic view of a battery cell system in accordance with multiple embodiments of present disclosure.

FIG. 4B is a schematic cross-sectional view of an embodiment of the battery cell test fixture of the present disclosure implemented with a test anode.

FIG. 4C is a schematic cross-sectional view of an embodiment of the battery cell test fixture of the present disclosure implemented with a test cathode.

Like reference numerals refer to like parts throughout the description of several views of the drawings.

DETAILED DESCRIPTION

One or more specific, example embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The terms "first," "second," and the like, herein do not denote any order, quantity, or importance, but rather are used to distinguish one element from another, and the terms "a" and "an" herein do not denote a limitation of quantity, but rather denote the presence of at least one of the referenced items.

The battery systems described herein may be used to provide power to a number of different types of xEVs as well as other energy storage applications (e.g., electrical grid power storage systems). Such battery systems may include one or more battery modules, each battery module having a number of battery cells (e.g., lithium ion electrochemical cells) arranged to provide particular voltages and/or currents useful to power, for example, one or more components of an xEV. Generally, the battery cells include electrochemical materials (e.g., electrolytes, electrode active materials), which are responsible for much of the electrical activity of the battery cell. The electrochemical materials are housed within, and supported by, certain mechanical features of the cell, such has a housing 6 of the battery cell, a current collector of the battery cell, and so forth.

Figure 1:
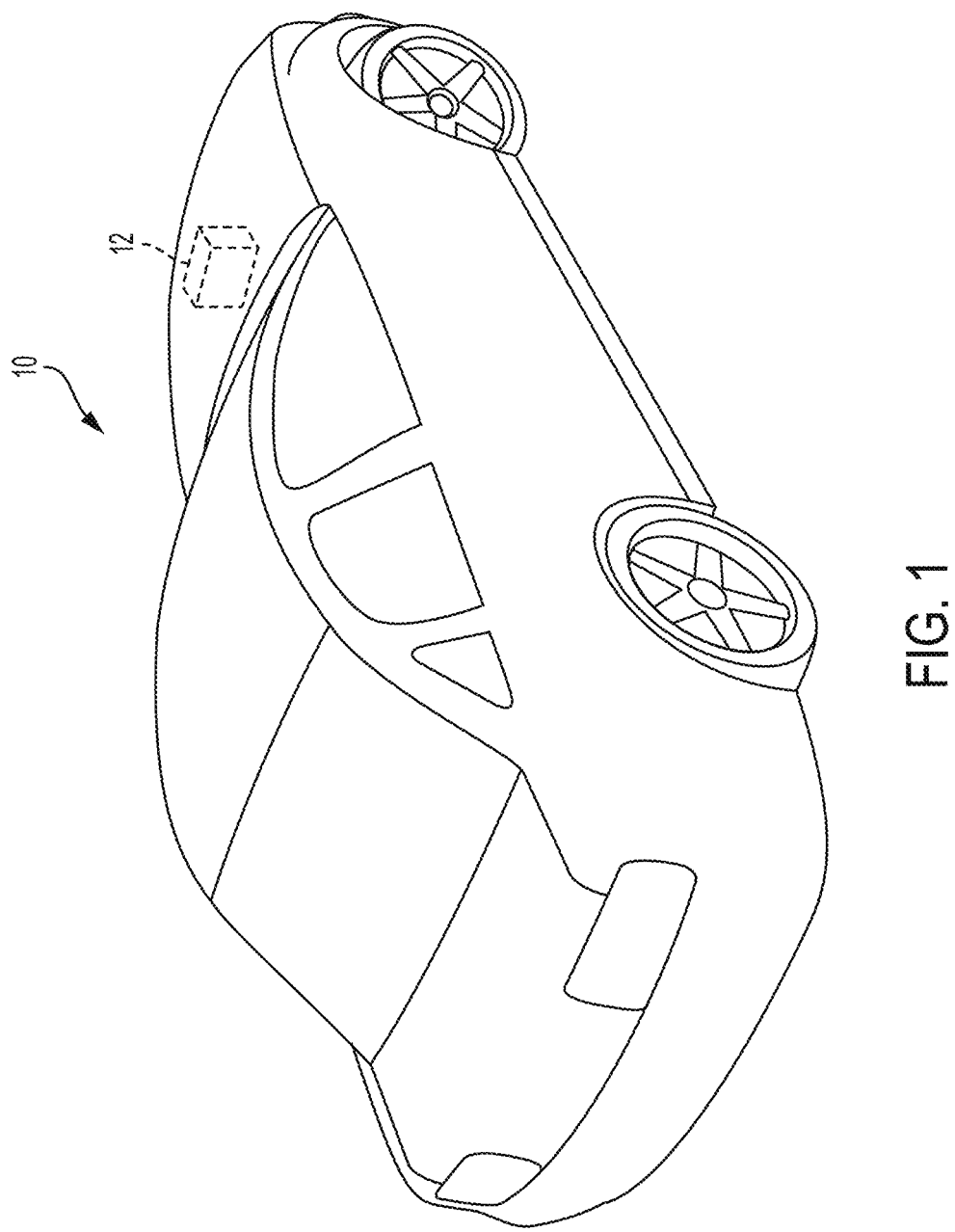
FIG. 1 is a perspective view of an xEV having a battery system configured in accordance with the embodiments of the present disclosure to provide power for various components of the xEV.
Figure 2:
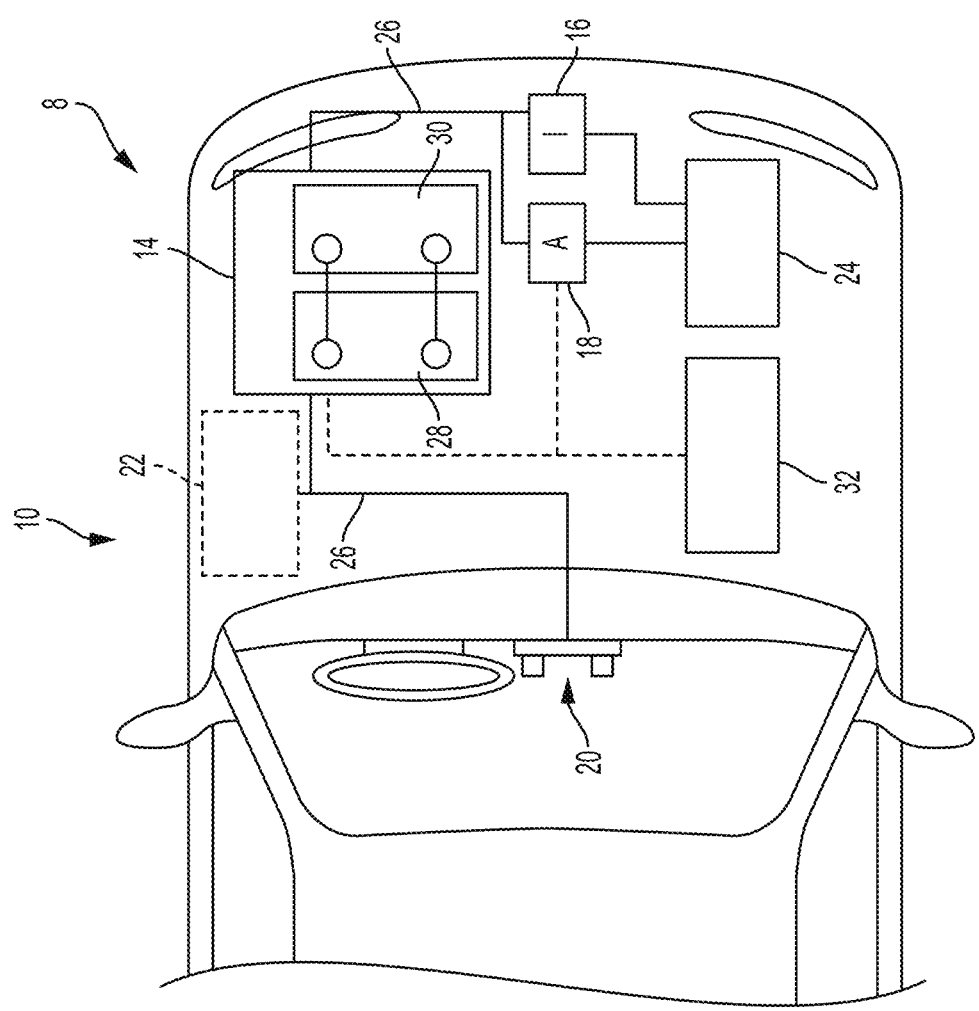
FIG. 2 is a cutaway schematic view of an embodiment of the xEV having the separator assembly and battery system of FIG. 1 and having a lithium ion battery in accordance with an aspect of the present disclosure.

A more detailed view of the battery system 12 is described in FIG. 2. As depicted, the vehicle propulsion system 8 may include an energy storage component 14 coupled to an ignition system 16, an alternator 18, a vehicle console 20, and optionally to an electric motor 22. Generally, the energy storage component 14 may capture/store electrical energy generated in the vehicle 10 and output electrical energy to power electrical devices in the vehicle 10. The energy storage component 14 may further include the lithium ion battery cell system 28 of the present disclosure and a lead acid battery 30.

In other words, the vehicle propulsion system 8 may supply power to components of the vehicle's electrical system, which may include radiator cooling fans, climate control systems, electric power steering systems, active suspension systems, auto park systems, electric oil pumps, electric super/turbochargers, electric water pumps, heated windscreen/defrosters, window lift motors, vanity lights, tire pressure monitoring systems, sunroof motor controls, power seats, alarm systems, infotainment systems, navigation features, lane departure warning systems, electric parking brakes, external lights, or any combination thereof. Illustratively, in the depicted embodiment, the energy storage component 14 supplies power to the vehicle console 20 and the ignition system 16, which may be used to start (e.g., crank) the internal combustion engine 24.

Additionally, the energy storage component 14 may capture electrical energy generated by the alternator 18 and/or the electric motor 22. In some embodiments, the alternator 18 may generate electrical energy while the internal combustion engine 24 is running. More specifically, the alternator 18 may convert the mechanical energy produced by the rotation of the internal combustion engine 24 into electrical energy. Additionally or alternatively, when the vehicle 10 includes an electric motor 22, the electric motor 22 may generate electrical energy by converting mechanical energy produced by the movement of the vehicle 10 (e.g., rotation of the wheels) into electrical energy. Thus, in some embodiments, the energy storage component 14 may capture electrical energy generated by the alternator 18 and/or the electric motor 22 during regenerative braking. As such, the alternator and/or the electric motor 22 are generally referred to herein as a regenerative braking system.

To facilitate capturing and supplying electric energy, the energy storage component 14 may be electrically coupled to the vehicle's electric system via a bus 26. For example, the bus 26 may enable the energy storage component 14 to receive electrical energy generated by the alternator 18 and/or the electric motor 22. Additionally, the bus 26 may enable the energy storage component 14 to output electrical energy to the ignition system 16 and/or the vehicle console 20. Accordingly, when a 12 volt battery system 12 is used, the bus 26 may carry electrical power typically between 8-18 volts.

Additionally, as depicted, the energy storage component 14 may include multiple battery modules. For example, in the depicted embodiment, the energy storage component 14 includes a lithium ion battery 28 and a lead-acid battery 30, which each includes one or more battery cells. In other embodiments, the energy storage component 14 may include any number of battery modules. Additionally, although the lithium ion battery module 28 and lead-acid battery module 30 are depicted adjacent to one another, they may be positioned in different areas around the vehicle. For example, the lead-acid battery module may be positioned in or about the interior of the vehicle 10 while the lithium ion battery module 28 may be positioned under the hood of the vehicle 10.

To facilitate controlling the capturing and storing of electrical energy, the propulsion system 8 may additionally include a control module 32. More specifically, the control module 32 may control operations of components in the battery system 12, such as relays (e.g., switches) within energy storage component 14, the alternator 18, and/or the electric motor 22. For example, the control module 32 may regulate amount of electrical energy captured/supplied by each battery module 28 or 30, perform load balancing between the battery modules 28 and 30, determine a state of charge of each battery module 28 or 30, determine temperature of each battery module 28 or 30, control voltage output by the alternator 18 and/or the electric motor 22, and the like.

In accordance with at least selected embodiments or objects, one aspect of the present disclosure provides a separator for a lithium-ion battery, such as, for example, a lithium ion battery (though the use of the separator is contemplated with other batteries as well), which separator 36 comprises a porous, permeable or semi permeable composite having a microporous substrate and a coating layer formed on at least one surface of the porous substrate, wherein the coating layer is formed from particles and/or a mixture of particles (inorganic and/or organic particles) and an aqueous or water-based polymeric binder.

The separator assembly 36 described herein may be advantageous because of its added ability to provide the status of a cell of a lithium ion battery. This improved, optimized, new, or modified separator for a lithium ion battery includes a base layer 34. The base layer 34 may be coated with a mixture of one or more types of particles (e.g., inorganic particles, such as, for example, ceramic particles, and/or organic particles, such as, for example, high temperature polymer particles) and one or more aqueous or water-based polymeric binders, where an aqueous or water-based polymeric binders may include one or more typically water-insoluble polymers (such as PVDF and/or various copolymers thereof) and may, in certain embodiments, further include one or more typically water-soluble polymers (such as, by way of example, polyvinyl alcohol or polyacrylic acid). The coating layer may prevent oxidation reactions from occurring at the interfaces of the coated separator and the electrodes in the battery and/or may improve the safety and/or the overall performance of a lithium ion battery.

As indicated, the ceramic coating helps to maintain the integrity of the base layer 34 of the separator. The particles can be of a variety of shapes, such as, but not limited to, rectangular, spherical, elliptical, cylindrical, oval, dog-bone shaped, or amorphous. The "particles" can also be fibrous-shaped or fibers. The particles in some embodiments are quite small and thus may have a large surface area per gram, which may enhance the absorption performance of the coating material and the interaction of the particles with the polymer matrix. Furthermore, in some embodiments, the particles, as purchased from the particle manufacturer, may, for example, be pre-coated with some material to enhance the compatibility of the particle with a polymeric matrix, to improve, possibly making more uniform, the dissolution of the particles in some portion of the polymer matrix, the dispersibility of the particles in the polymer matrix, to avoid particle agglomeration, and/or to stabilize the particles in the coating slurry.

It is understood that the base layer, the reference component, the separator assembly 36, the first contact 38 and the optional second contact 40 described herein may be referenced as being permeable, semi-permeable or porous throughout the present disclosure. Regardless of the term which is used—"permeable," "semi-permeable" or "porous" should be all be construed to mean that ions may pass through such material in a variety of degrees depending on the type of material used for (and the process used to manufacture/assemble such as sputtering/screen printing/painting/etc) the base layer, reference component, separator assembly, and/or first/second contacts.

With reference to FIGS. 3A-3B, 4A and 5, a battery cell separator assembly 36 in accordance with the present disclosure may include a base layer 34, a first contact 38, an optional second contact 40 and a reference component 42. While the base layer 34 is circular in FIGS. 3A-3B, the base layer 34 may be of any shape (rectangle, square, etc) depending on the configuration of the battery cell. Optional second contact 40 is shown in dashed lines to indicate that second contact 40 may not be used and the reference component 42 may then therefore be affixed directly to the base layer 34—as shown in FIG. 6. The base layer 34 may a first side 44 and a second side 46 as shown. The first contact 38 may, but not necessarily, be formed from copper if used with an anode electrode. Also, the first contact 38 may, but not necessarily be formed from gold if used with cathode electrode. The optional second contact 40 may but not necessarily be formed from gold or other similar low resistance material. Referring to FIG. 4A in particular, an optional middle separator 35 is shown which prevents the reference material 42 from touching any structure other than the base layer and/or the optional second contact 40. It is understood that in lieu of using an optional middle separator as shown in FIG. 4A, the reference material may be powdered or coated with a ceramic material or the like to protect the reference material against short circuiting in the event it contacts other structures in the battery.

Figure 5:
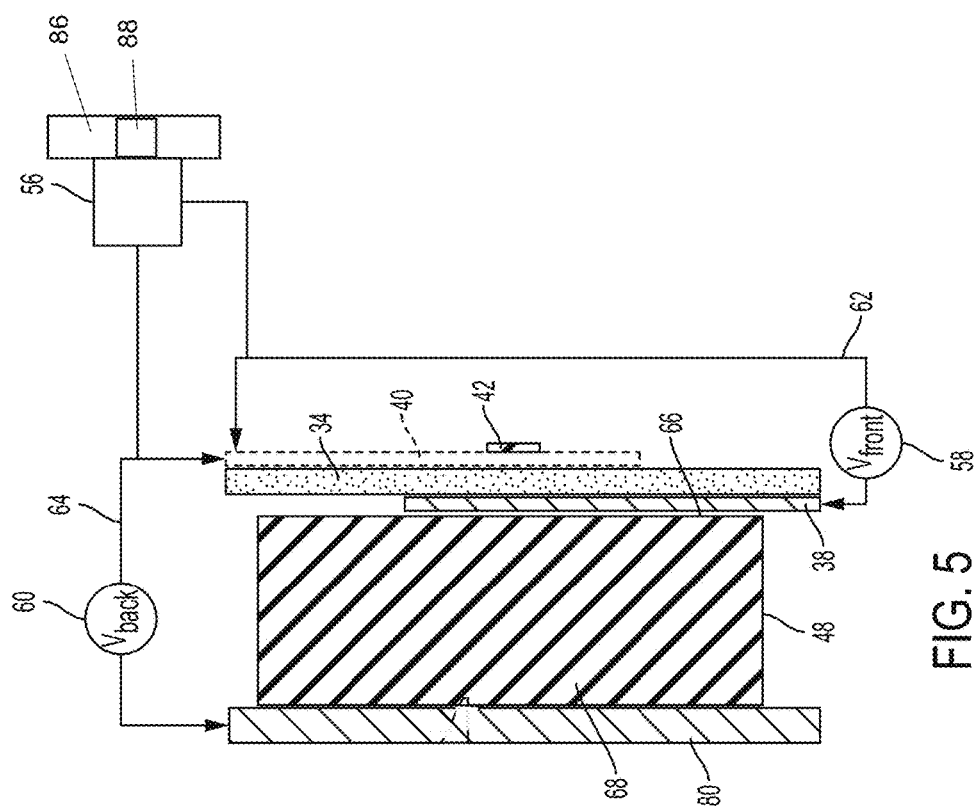
FIG. 5 is an enlarged, side schematic view of the separator assembly of the present disclosure relative to an anode for a vehicle battery.
Figure 6A:
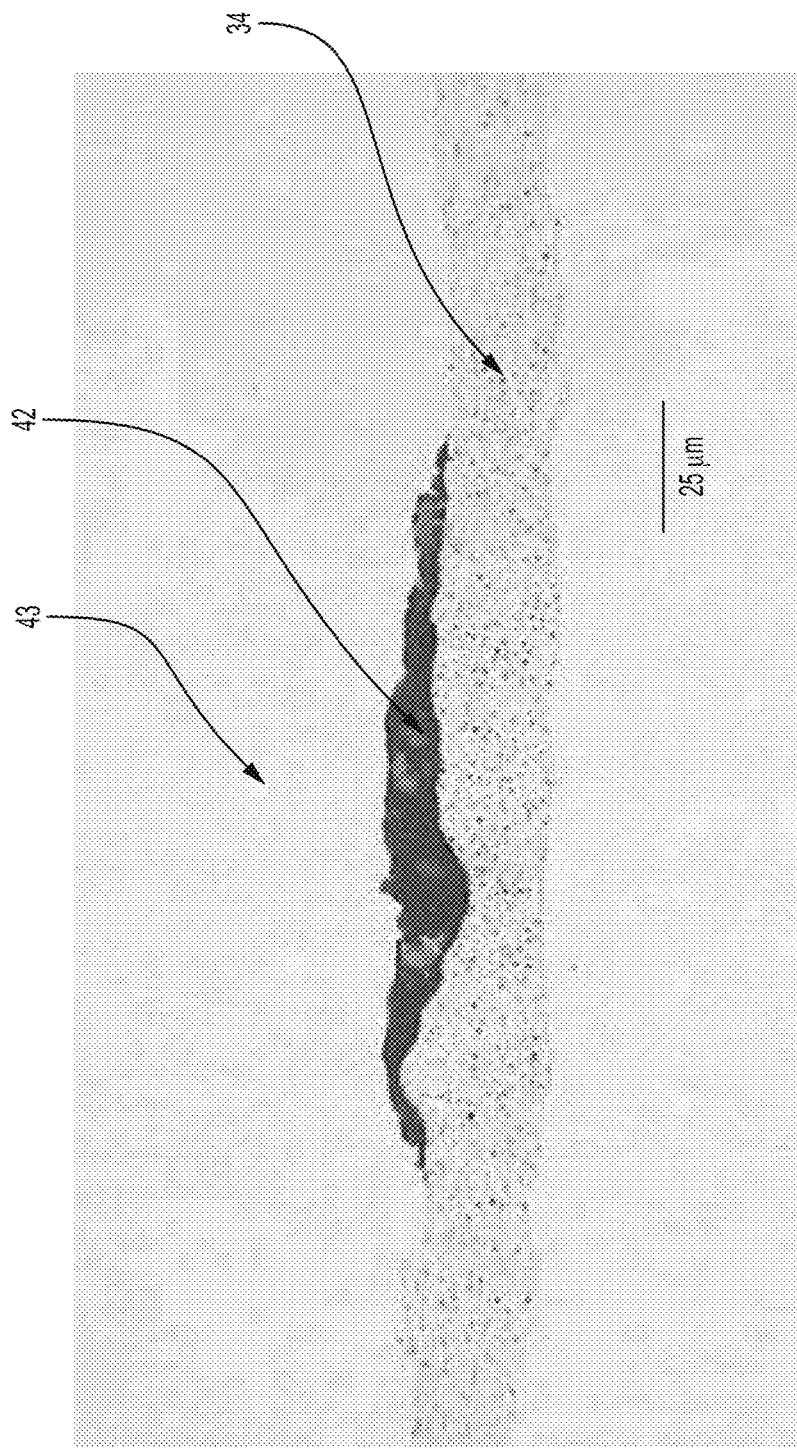
FIG. 6A is a magnified cross sectional view of an embodiment of the present disclosure where the reference component is affixed directly to the base layer or base element.
Figure 6B:
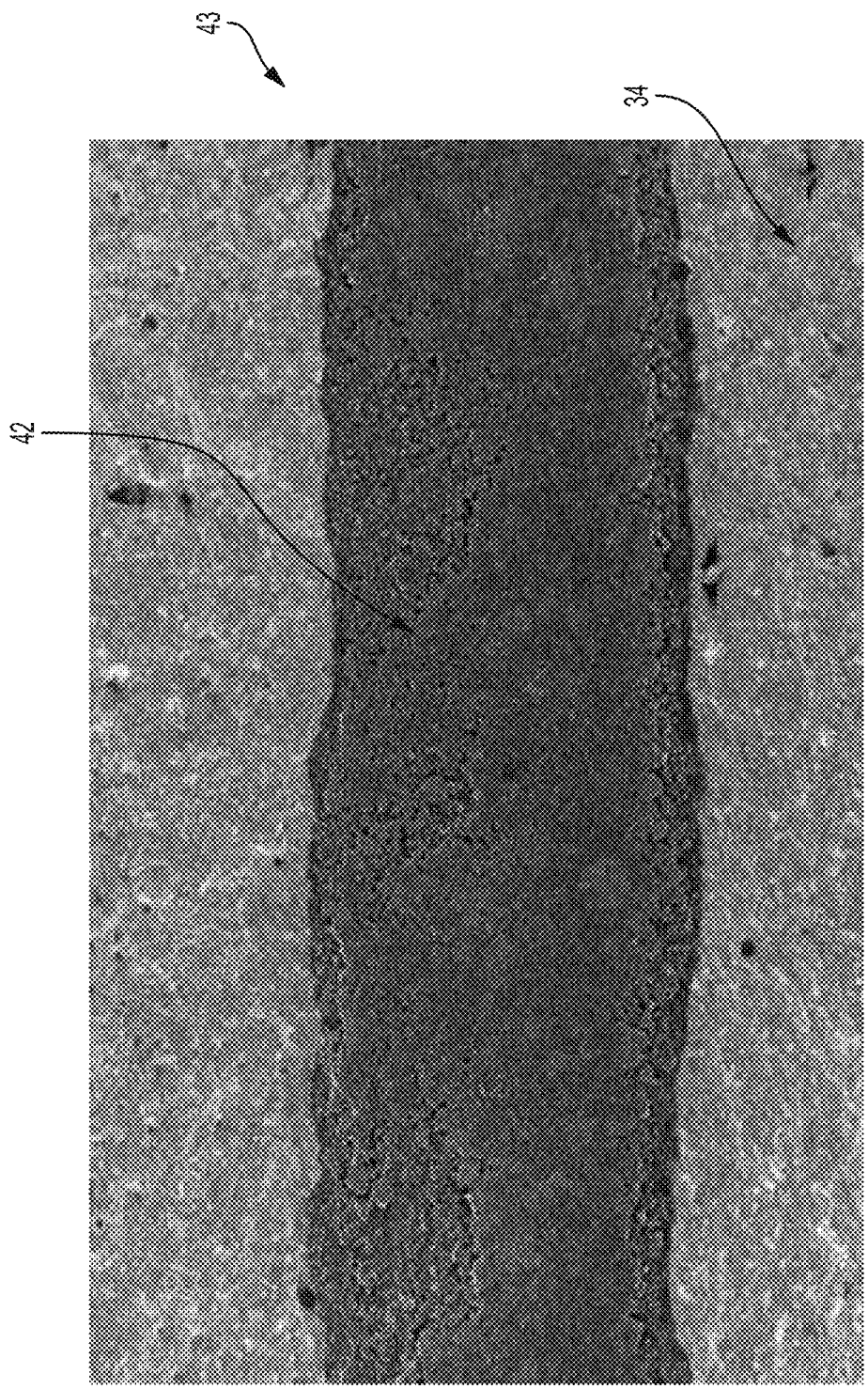
FIG. 6B is a magnified plan view of an embodiment of the present disclosure where the reference component is affixed directly to the base layer or base element.

As shown in FIGS. 3A-3B, 4A and 5, the first contact 38 may be affixed on the first side 44 of the base layer 34 such that the first contact 38 is "sandwiched" between the base layer 34 and an electrode 48 which may be an anode or a cathode. In this arrangement, the first contact 38 is proximate to or adjacent to the electrode 48 as shown in FIG. 5. The optional second contact 40, when implemented, may be disposed on the second side 46 of the base layer 34; and a reference component 42 may be disposed on the second contact 40.

The reference component 42 is operatively configured to be porous and/or may allow lithium ions 54 to pass through the reference component 42. The porous construction is achieved by spraying on or screen printing (or similar process) the material onto the base layer 34 which may have a ceramic coating. The resulting arrangement for reference component 42 is visible in FIG. 6. The reference component may be formed from material such as iron phosphate, lithium titanate, or another like metal oxide. It is understood that the reference component 42 is formed from a material which has a constant voltage (or does not vary much) no matter what the state of charge is—with the exception of very low or very high state of charge. By having a constant voltage, the reference component 42 allows a user/system to compare the fixed voltage to other points in a system. Moreover, the reaction kinetics of the reference component 42 material should be facile in order that the small amount of current flow permitted by the meter 56 in order to obtain a measurement of voltage differences 58, 60 should not cause polarization of the reference voltage itself.

It is understood that the metal oxide used for the reference component 42 may be mixed with a hydrocarbon binder and a solvent such that a slurry is formed. The reference component 42 then may be sprayed, screen printed or drawn out onto the second contact 40 in order to make the reference component 42 porous to allow lithium ions 54 to pass through the reference component 42 itself. Moreover, the base layer 34 may also be formed from filler material enabling or causing anisotropic electrical and/or thermal conduction. For example, the base layer 34 may include nanomaterials such as metallic, semi-metallic, or carbon-based nanoparticles, nanotubes, nanofibers, sheets or layers of graphene, or the like. Further, certain fillers may be used to provide enhanced structural characteristics. In addition to or in lieu of conductive fillers, structural fillers may be used, such as fibers, beads, granules, or the like, of a ceramic material, such a silicate or borosilicate glass, or any other suitable material. The base layer 34 may also include porous material such as polyolefin (e.g., polyethylene, polypropylene), a polyarene (e.g., polystyrene, polyphenylene sulfide), or the like which further allow for lithium ions 54 to pass through the base layer 34.

Referring again to FIGS. 4A and 5, the battery cell separator assembly 36 may also include a meter 56 operatively configured to read a first voltage 58 difference between the first contact 38 and the second contact 40 via a first circuit 62 or electrical communication therebetween. It is understood that the same meter 56 or another meter may be implemented which reads a second voltage 60 between the second contact 40 and an anode current collector 80 via a second circuit 64 or electrical communication therebetween.

With respect to all embodiments of the present disclosure, the second voltage 60 reading (from the back of the anode/cathode) may be compared with the first voltage 58 reading (from the front side 66 of the anode/cathode) in order to determine the health of the electrode 48 (anode/cathode), stability of the electrode 48 as well as the SOC of the electrode 48 among other factors. All of this data may be used in various settings. In a product development or laboratory setting, the data could be used to develop a mathematical model for a particular battery such that the mathematical model could be implemented on such batteries when used on production level, operating vehicles. The mathematical model would be implemented (in lieu of a wired voltmeter and associated circuits in the batter) to provide real-time battery feedback to a vehicle user or to a remote location which may be monitoring or managing the battery. Alternative to using the first and second voltages and other battery data to develop a mathematical model, the data may be simply routed from the circuits and voltmeter 56 to a control module which then communicates the data and/or battery conditions to vehicle user (where the separator assembly 36 is used on a working vehicle) or to a remote location or user. A non-limiting example where remote battery monitoring may be useful is in an electric fleet vehicle where battery charges and battery health may be managed remotely. Accordingly, the resulting data and/or model can be used accurately identify the SOC and to protect the battery (ex: identify lithium plating on anode; or data may notify user when battery limits are achieved or nearing the limits in order to help protect the lithium ion battery.

It is understood that the reference component 42 may be used in a variety of environments where it is desirable to have an unobtrusive reference electrode which could be affixed to any base element. Accordingly, the reference electrode of the present disclosure includes a porous reference component 42 wherein base layer 34 can be any base element 34 (not necessarily a separator or base layer 34 for a separator in a battery environment). However, similar to the battery environment, reference component 42 may be coupled to a base element 34 directly or via an optional contact 40 where reference component 42 may be porous or semi-permeable in that it allows a variety of ions to pass through the reference component. Accordingly, a reference structure 43 may be formed from the reference component 42 as described together with a base element 34 wherein the reference component 42 may be in electrical communication with at least one of an electrode current collector 80 or a first contact 38. As indicated, the reference component 42 is formed by material such as, but not limited to iron phosphate, which may be coupled to the base layer and/or optional contact via a screen printing method, spray painting method or the like to achieve the porous and/or semi-permeable structure for reference component 42. To the extent a contact 40 is used, the optional contact 40 may but not necessarily be sputtered onto the base element 34 such that ionic material may also pass through the optional second contact.

Accordingly, with reference to FIG. 4A, a lithium ion battery cell system 28 may also be provided according to various embodiments of the present disclosure. The aforementioned battery cell system may be installed on a vehicle which provides a user with information regarding the state of charge and battery health. The battery cell system 28 may include an anode 50 and a cathode 52 disposed in a lithium ion non-aqueous solution 74 within a hermetically sealed housing 6 in addition to a separator 36 which is comprised of a base layer 34, a first contact 38, an optional second contact 40 and a reference component 42 which are all integrated into the separator. The base layer 34 may have a ceramic coating and includes a first side 44 and a second side 46. The base layer 34 is operatively configured to separate the anode and the cathode in the aqueous lithium ion solution 74. The first contact 38 is affixed to the first side 44 of the base layer 34 between the base layer 34 and an anode. The optional second contact 40 is affixed to the second side 46 of the base layer 34 and the reference component 42 is disposed on the second contact 40. Both the first and second contacts have a porous composition which allow lithium ions 54 to pass through the contacts. This porous composition is achieved by implementing a process such as sputtering where the contact material is applied to the base layer 34 atom by atom. The reference component 42 for each electrode (shown as an anode 50 and cathode 52) also has a porous composition which allows lithium ions 54 to pass through the reference component 42. It is understood that the reference component 42 may be a metal oxide which is mixed with a hydrocarbon binder and a solvent such that a slurry is formed. The reference component 42 may be applied to the base layer 34 (or to the second contact 40 when implemented) via a method such as screen printing, spraying or the like. Accordingly, the reference component 42 as well as the base layer 34 and contacts are sufficiently porous to allow lithium ions 54 to pass through the reference component 42 and the base layer 34. The reference component 42/first and second contacts in the battery cell system are similar to those in the separator assembly 36 in that the reference component 42 may be made from material such as iron phosphate while the first contact 38 may be formed from material such as copper and the optional second contact 40 may be formed from low resistance material such as gold.

Moreover, the base layer 34 may also be formed from filler material enabling or causing anisotropic electrical and/or thermal conduction. For example, the base layer 34 may include nanomaterials such as metallic, semi-metallic, or carbon-based nanoparticles, nanotubes, nanofibers, sheets or layers of graphene, or the like. Further, certain fillers may be used to provide enhanced structural characteristics. In addition to or in lieu of conductive fillers, structural fillers may be used, such as fibers, beads, granules, or the like, of a ceramic material, such a silicate or borosilicate glass, or any other suitable material. The base layer 34 may also include porous material, such as but not limited to, polyolefin (e.g., polyethylene, polypropylene), a polyarene (e.g., polystyrene, polyphenylene sulfide), or the like which further allow for lithium ions 54 to pass through the base layer 34. The battery system may also include a meter 56 operatively configured to read a first voltage 58 between the first contact 38 and the second contact 40 via a first electrical communication therebetween.

It is understood that the battery cell system 28 having a meter 56 may be disposed on an operating electric vehicle in order to enable a vehicle user to determine the health of the battery in real time via the meter 56 itself or via a vehicle control module which communicates with the battery. It is also understood that the battery system of the present disclosure may engage in remote communications with a base unit so that a base unit may remotely monitor the health of the battery system of the present disclosure.

Accordingly, in furtherance of the objective to monitor the state of charge of a vehicle battery cell among other objectives, the first contact 38 in the battery system 28 of the present disclosure may be affixed to the first side 44 of the base layer 34 as shown in FIG. 5. This proximate location of the first contact 38 being adjacent to the front side 66 of the anode provides the benefit of obtaining the voltage at the front of the electrode 48 (instead of the back of the electrode 48). The voltage at the front side 66 of the electrode 48 is more pertinent for some aspects of cell control or health and SOC (state of charge) estimations. Moreover, given that the first contact 38, optional second contact 40, base layer 34, and the reference material are all formed from porous material via processes such as sputtering, spray painting or like processes as explained herein. Therefore, the aforementioned components are all operatively configured to allow lithium ions 54 to pass through the separator assembly 36, and the separator's integrated reference electrode 48 do not impede the operation of the battery cell.

Accordingly, given that the first voltage 58 at the front side 66 of the electrode 48 may be obtained while allowing lithium ion pass-through, the present disclosure provides a more accurate data feedback for the electrode 48. Moreover, the meter 56 as provided by the present disclosure, is operatively configured to read a first voltage 58 between the first contact 38 (proximate to the front side 66 of the electrode 48) and the optional second contact 40 (associated with the reference component 42) via a circuit therebetween. The meter 56 may also be operatively configured to read a second voltage 60 between an electrode collector 80 (adjacent to the back side 68 of the electrode 48) and the optional second contact 40 (associated with the reference component 42). The first and second voltages from the front and back sides 66, 68 of the electrode 48 provide a user with accurate voltage data for the electrode 48.

With reference to FIGS. 4B and 4C, the battery cell separator assembly 36 of the present disclosure may also be implemented as part of a testing fixture 70 as provided by the present disclosure. Accordingly, a battery cell testing fixture 70 may be provided where the battery cell testing fixture 70 includes a stand 72, a base layer 34 disposed in a lithium ion solution 74, a first contact 38, an optional second contact 40, a reference component 42, and a meter 56. The stand 72 of the battery cell testing fixture 70 is operatively configured to hold an anode 50 and a cathode 52 in a lithium ion solution 74. The anode 50, the cathode 52 and the lithium ion solution 74 may be disposed in a hermetically sealed housing 6 which is then disposed or affixed to the stand 72. It is also understood that a base layer 34 which functions as a separator may also be disposed in the lithium ion solution 74 in order to separate the anode 50 and the cathode 52.

The base layer 34 may also be formed from filler material which enables anisotropic electrical and/or thermal conduction and may be coated with a ceramic material to maintain/protect the integrity of the filler material. For example, the base layer 34 may include nanomaterials such as metallic, semi-metallic, or carbon-based nanoparticles, nanotubes, nanofibers, sheets or layers of graphene, or the like. Further, certain fillers may be used to provide enhanced structural characteristics. In addition to or in lieu of conductive fillers, structural fillers may be used, such as fibers, beads, granules, or the like, of a ceramic material, such a silicate or borosilicate glass, or any other suitable material. The base layer 34 may also include polymeric material such as polyolefin (e.g., polyethylene, polypropylene), a polyarene (e.g., polystyrene, polyphenylene sulfide), or the like which further allow for lithium ions 54 to pass through the base layer 34. As previously indicated, the base layer 34 of the separator assembly 36 may also include a ceramic coating in order to maintain the integrity of the base layer 34 of the separator in order to maintain the separation of the anode and the cathode. The base layer 34, having a first side 44 and a second side 46, may be disposed in the lithium ion solution 74 of a test battery cell.

The base layer 34 together with the first contact 38, the optional second contact 40, and the reference component 42 form a separator assembly 36. The first contact 38 may be affixed to the first side 44 of the base layer 34 between the base layer 34 and the anode in order to provide data or the voltage at the front side 66 of the electrode 48 (shown as anode 50 in FIG. 4C or cathode 52 in FIG. 4B). The battery cell testing fixture 70 provides for an electrical communication between the first contact 38 and the optional second contact 40 where the meter 56 may obtain a first voltage 58 between the first and second contacts. It is understood that the first contact 38 may be formed from copper or other similar conductive material which is sputtered onto the first side 44 of the base layer 34 such that the first contact 38 is also porous and allows for lithium ions 54 to pass through the separator toward the anode. It is also understood that the optional second contact 40 may, but not necessarily, formed from gold or other like material. Similar to the first contact 38, the optional second contact 40 may also be sputtered onto the second side 46 of the base layer 34 so that the optional second contact 40 is also porous and allows for lithium ions 54 to pass through the separator.

As shown in FIG. 5, the optional second contact 40 may serve as an electric conduit to the meter 56 for the otherwise high resistance reference component 42 of the separator. Accordingly, the optional second contact 40 may serve as means to obtain the voltage reading (via the meter 56) between the reference component 42 and other portions of the battery cell such as the anode collector 80 which may be disposed on the back side 68 of the anode as shown and the first contact 38 which may be disposed proximate to the front side 66 of the anode as shown.

Similar to the reference component 42 of the separator assembly 36 previously described, the reference component 42 of the battery cell testing fixture 70 may also be sprayed, screen printed (or like process) onto the second contact 40 (where used) on the second side 46 of the base layer 34 in order to provide a porous reference component 42 which allows lithium ions 54 to pass through the reference component 42, optional second contact 40, and base layer 34. If the optional second contact 40 is not used, the reference component 42 is sprayed/printed/etc directly onto the coated base layer 34 of the separator assembly 36. Similar to the previous components in the separator assembly 36 and the battery cell system, the optional second contact 40 may be formed from copper or other similar material which is also porous and allows lithium ions 54 to pass through. In order to obtain a porous structure in the second contact 40, the second contact 40 may, but not necessarily, be sputtered onto the second side 46 of the base layer 34.

The battery cell testing fixture 70 may further include a meter 56 which is operatively configured to read a first voltage 58 between the first contact 38 and the reference component 42 (optionally through a second contact 40) via a first circuit 62 therebetween. The first voltage 58 is particularly useful in that this voltage relates to the front side 66 of the electrode 48 and may be compared with the second voltage 60 from the back side 68 of the electrode 48 to determine many operating conditions for the tested battery cell. It is understood that the first voltage 58 from the front side 66 of the electrode 48 was generally not available due to previous concerns about monitoring equipment impeding the pass-through of lithium ions 54. The same meter 56 for reading the first voltage 58 may, but not necessarily be used to also read a second voltage 60 between the reference component 42 (directly or via an optional second contact 40) and a current collector 80 (at the back side 68 of the electrode 48) via a second circuit 64 therebetween. Accordingly, the porous nature of the first and second contacts affixed to the base layer 34 as well as the porous nature of the reference component 42 enable the battery cell test fixture to obtain a voltage reading at the front of the electrode 48 thereby providing more comprehensive data for the electrode 48.

It is understood that the base layer 34 of the separator assembly 36 used in all embodiments of the present disclosure must have an appropriate thickness wherein the base layer 34 may consist of a single layer of material or the base layer 34 may consist of multiple layers of material. With respect to thickness, if the base layer 34 of the separator assembly 36 is too thin, insufficient electrical insulation may result. On the other hand, if the base layer 34 of the separator is too thick, insufficient thermal transfer may occur. Even in situations where thermal gradients are not a substantial consideration from the standpoint of the separator 52, if the base layer 34 is too thick, there may be also be insufficient room within the housing 6 to fit all the battery cells with a rather thick battery cell separator 52. By way of non-limiting example, the base layer 34 may, but not necessarily, have an acceptable thickness between approximately 0.025 mm and approximately 0.05 mm.

In yet another embodiment for the battery cell testing fixture 70 of the present disclosure, the testing fixture may include a user interface 86 and a separator assembly 36 in communication with the user interface. The separator assembly 36 may be operatively configured to be used with a plurality of test batteries 90 in succession as each test battery is evaluated over a period of time. The separator assembly 36 includes an integrated reference electrode formed from at least a permeable reference component 42 affixed to the base layer 34 via a screen printing process or the like. It is understood that the permeable reference component 42 may be semi-permeable or completely permeable depending on the degree of porosity of the reference component or the type of material used in the reference component or the process used to affix the reference component to the base layer 34—painting, printing or the like. The separator assembly 36 is operatively configured to communicate with a current collector of one of the plurality of test batteries 90, a meter 56 and the user interface 86.

The battery cell testing fixture 70 may, but not necessarily, include a stand 72 which is coupled to at least one of the user interface 86, a test battery 90 or separator assembly 36. It is understood that the separator assembly 36 includes a base layer having a first side and a second side 44, 46 with the semi-permeable reference component 42 coupled to the second side 46 of the base layer 34. The permeable reference component 42 may be operatively configured to allow ions 54 to pass through the reference electrode (which may include the reference component 42, optionally first contact 38 and second contact 40). It is understood that the separator assembly 36 is operatively configured to separate the anode 50 and the cathode 52 in each of the plurality of test batteries 90 used with the testing fixture. Similar to earlier embodiments, the permeable first contact 38 may affixed to a first side 44 of the base layer via a sputtering process or the like such that the first contact is also permeable to ions. The first contact 38 may be communication with the reference component 42 via a first circuit.

As shown in FIGS. 4B and 4C, the first contact is operatively configured to be adjacent to an electrode (either the anode 50 or the cathode 52 or both) in one of the plurality of test batteries. It is also understood that an optional second contact 40 may be affixed to the reference component 42 and the second side 46 of the base layer. The optional second contact may be in communication with a current collector of a test battery via a second circuit. Like the first contact 38, the optional second contact 40 may also have a permeable structure and is affixed to the base layer 34 via a sputtering process or the like in order to achieve the permeable structure. It is understood that the user interface 86 includes a module 88 in communication with the first and second circuits 62, 64 such that the module 88 may determine the status of the test cell via a model or the like. The module then outputs the status of the test cell (such as the state of charge or the state of the test cell relative to the cell limits) to a user via the user interface 86.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed descriptions will provide those skilled in the art with a convenient road map for implementing the exemplary embodiment or exemplary embodiments. It should be understood that various changes can be made in the function and arrangement of elements without departing from the scope of the disclosure as set forth in the appended claims and the legal equivalents thereof.

What is claimed is:

1. A battery cell testing fixture comprising:
    a stand operatively configured to hold an anode and a cathode in a lithium ion solution within a housing;
    a base layer having a first side and a second side disposed in the lithium ion solution, the base layer operatively configured to separate the anode and the cathode in the lithium ion solution;
    a first contact affixed to the first side of the base layer between the base layer and the anode, the first contact being proximate to a front side of one of the anode or the cathode;
    a reference component disposed on the second side;
    a collector disposed on a back side of one of the anode or the cathode, the collector being configured to determine voltage at the back side of one of the anode or the cathode; and
    a meter in communication with the reference contact and the first contact;
    wherein the first contact and the reference component are configured to determine voltage at the front side of one of the anode or cathode.

2. The battery cell testing fixture as defined in claim 1 further comprising a second contact affixed to the second side of the base layer and the reference component, the second contact being in communication with the reference component, the meter and the first contact via a first circuit and being in communication with the reference component, the meter and the current collector via a second circuit.

3. The battery cell testing fixture as defined in claim 2 wherein the base layer, the first and second contacts, and the reference component are each operatively configured to allow lithium ions to pass through.

4. The battery cell testing fixture as defined in claim 3 wherein the meter is operatively configured to read a first voltage at the first circuit and a second voltage at the second circuit.

5. The battery cell testing fixture as defined in claim 4 wherein the meter is in communication with an algorithm in a control unit for determining the state of charge for the battery cell.

* * * * *